United States Patent
Jia (10) Patent No.: US 9,906,226 B2
(45) Date of Patent: Feb. 27, 2018

(54) MULTI-MODULUS FREQUENCY DIVIDER AND ELECTRONIC APPARATUS INCLUDING THE SAME

(71) Applicant: Semiconductor Manufacturing International (Shanghai) Corporation, Shanghai (CN)

(72) Inventor: Hailong Jia, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 80 days.

(21) Appl. No.: 14/805,178

(22) Filed: Jul. 21, 2015

(65) Prior Publication Data
US 2016/0072509 A1    Mar. 10, 2016

(30) Foreign Application Priority Data

Sep. 4, 2014 (CN) .......................... 2014 1 0448881

(51) Int. Cl.
| | |
|---|---|
| *H03K 21/00* | (2006.01) |
| *H03K 23/00* | (2006.01) |
| *H03K 21/02* | (2006.01) |
| *H03K 23/58* | (2006.01) |
| *G06F 1/08* | (2006.01) |
| *H03L 7/197* | (2006.01) |
| *H03L 7/193* | (2006.01) |
| *H03K 21/38* | (2006.01) |

(52) U.S. Cl.
CPC ......... *H03K 21/026* (2013.01); *H03K 23/586* (2013.01); *G06F 1/08* (2013.01); *H03K 21/00* (2013.01); *H03K 21/023* (2013.01); *H03K 21/38* (2013.01); *H03K 23/00* (2013.01); *H03L 7/193* (2013.01); *H03L 7/1974* (2013.01)

(58) Field of Classification Search
None
See application file for complete search history.

(56) References Cited

U.S. PATENT DOCUMENTS

| | | | |
|---|---|---|---|
| 5,341,031 A * | 8/1994 | Kinoshita ............ | H03K 5/1515 327/115 |
| 6,784,851 B2 * | 8/2004 | Merrill ............... | H01Q 21/0006 343/853 |
| 7,924,069 B2 | 4/2011 | Narathong et al. | |
| 8,542,040 B1 * | 9/2013 | O'Day ................ | H03K 23/667 327/115 |

(Continued)

*Primary Examiner* — Tuan T Lam
(74) *Attorney, Agent, or Firm* — Innovation Counsel LLP (57) ABSTRACT

A multi-modulus frequency divider includes a frequency division module, a frequency selection module, and a retiming module. The frequency division module is configured to receive an input signal and perform mufti-mode frequency processing on the input signal, so as to generate and output a plurality of divided signals to the frequency selection module. The frequency selection module is configured to receive the plurality of divided signals from the frequency division module, select a divided signal having a desired frequency from among the plurality of divided signals, and output the selected divided signal to the retiming module. The retiming module is configured to receive the selected divided signal from the frequency selection module, perform a retiming operation on the selected divided signal, and output a retimed selected divided signal.

11 Claims, 4 Drawing Sheets

(56) References Cited

U.S. PATENT DOCUMENTS

| | | | |
|---|---|---|---|
| 8,552,770 B2 | 10/2013 | Cavin | |
| 8,565,368 B1 * | 10/2013 | Chen | H03K 23/68 |
| | | | 377/47 |
| 8,891,725 B2 * | 11/2014 | Terrovitis | H03K 23/002 |
| | | | 377/47 |
| 9,118,333 B1 * | 8/2015 | Mika | H03K 23/70 |
| 2004/0202275 A1 * | 10/2004 | Wang | H03C 3/0925 |
| | | | 377/47 |
| 2007/0147571 A1 * | 6/2007 | Yu | H03K 21/023 |
| | | | 377/47 |
| 2008/0186063 A1 * | 8/2008 | Jewett | H03K 21/08 |
| | | | 327/117 |
| 2008/0225989 A1 * | 9/2008 | An | G06F 7/68 |
| | | | 375/326 |
| 2009/0245418 A1 * | 10/2009 | Yamaji | H04L 27/368 |
| | | | 375/297 |
| 2010/0046693 A1 * | 2/2010 | Ellersick | H03K 23/42 |
| | | | 377/47 |

* cited by examiner

MULTI-MODULUS FREQUENCY DIVIDER AND ELECTRONIC APPARATUS INCLUDING THE SAME

CROSS-REFERENCE TO RELATED APPLICATION

This application claims priority to Chinese Patent Application No. 201410448881.3 filed Sep. 4, 2014, the disclosure of which is incorporated herein by reference in its entirety.

BACKGROUND

Technical Field

The present disclosure generally relates to frequency division, and more particularly to a multi-modulus frequency divider and an electronic apparatus including the same.

Description of the Related Art

A multi-modulus divider (MMD) is a frequency division module that is widely used in conventional phase-locked loop (PLL) technology. A MMD circuit includes a plurality of cascaded frequency divider cells (for example: frequency divider cells that divide by 2 or 3, herein abbreviated as DIV2/3). The frequency divider cells are configured to generate a corresponding output frequency based on an input frequency and a division factor/ratio (divisor).

A basic MMD structure includes a continuous frequency division range of $2^N \sim 2^{N+1}-1$. In some mixed logic circuits, the frequency division range may be extended to $2^{N-M} \sim 2^{N+1}-1$.

Currently, a MMD including a plurality of DIV2/3 cells is primarily based on the following two methods. The first method is based on single-end clock signal cascading at complementary metal-oxide-semiconductor (CMOS) level, and is primarily employed in a multi-modulus divider having relatively lower frequency (generally less than 2 GHz). The second method is based on differential signal cascading of current mode logic (CML), and is primarily employed in high-speed radio frequency (RF) circuit, but requires high power consumption.

With the continuous scaling in chip process technology node, increase in operating frequency, and increasing demand for low power consumption, there arises a need for a MMD that can maintain low power consumption while operating in the radio frequency (RF) band. However, the conventional MMD including the plurality of DIV2/3 cells is unable to meet the aforementioned need.

SUMMARY

The present disclosure addresses at least the above deficiencies in the prior art, by providing a mufti-modulus frequency divider that maintains low consumption while operating at radio frequencies.

According to an embodiment of the inventive concept, a mufti-modulus frequency divider is provided. The mufti-modulus frequency divider includes: a frequency division module, a frequency selection module, and a retiming module, wherein the frequency division module is configured to receive an input signal and perform mufti-mode frequency processing on the input signal, so as to generate and output a plurality of divided signals to the frequency selection module, wherein the frequency selection module is configured to receive the plurality of divided signals from the frequency division module, select a divided signal having a desired frequency from among the plurality of divided signals, and output the selected divided signal to the retiming module; and wherein the retiming module is configured to receive the selected divided signal from the frequency selection module, perform a retiming operation on the selected divided signal, and output a retimed selected divided signal.

In some embodiments, the frequency division module may include N number of differential cascading frequency divider cells configured to divide by 2 or by 3, wherein the frequency divider cells may include complementary metal-oxide-semiconductor (CMOS) logic-based high-speed differential D flip-flops, and wherein N may be an integer greater than or equal to 2.

In some embodiments, the N number of differential cascading frequency divider cells may be connected in stages, and wherein one or more of the frequency divider cells in subsequent stages after a first stage, that are not necessary to output the retimed selected divided signal, may be turned off.

In some embodiments, the one or more of the frequency divider cells in the subsequent stages after the first stage may be turned off by applying a mode stop (MS) signal to a mode stop (MS) input terminal of the one or more of the frequency divider cells in the subsequent stages.

In some embodiments, a MO terminal of each frequency divider cell may provide an output of the frequency divider cell, and may be configured to output a divided signal to a corresponding input terminal of the frequency selection module.

In some embodiments, a size of transistors in the frequency divider cells may be successively reduced starting from the frequency divider cell in a first stage to the frequency divider cell in an Nth stage.

In some embodiments, the frequency division module may include $2 \sim 2^{N+1}-1$ continuous variable frequency division ratios.

In some embodiments, the frequency selection module may include a multiplexer.

In some embodiments, the selected divided signal that is output by the frequency selection module may have a duty cycle of approximately 50%.

In some embodiments, the retiming module may include D flip-flops.

In some embodiments, a clock of the retiming module may be based on an input clock of the frequency division module.

In some embodiments, a retiming clock signal of the retiming module may be reconfigurable.

According to another embodiment of the inventive concept, an electronic apparatus is provided. The electronic apparatus includes: a multi-modulus frequency divider and at least one electronic component connected to the multi-modulus frequency divider. The multi-modulus frequency divider includes: a frequency division module, a frequency selection module, and a retiming module, wherein the frequency division module is configured to receive an input signal and perform mufti-mode frequency processing on the input signal, so as to generate and output a plurality of divided signals to the frequency selection module, wherein the frequency selection module is configured to receive the plurality of divided signals from the frequency division module, select a divided signal having a desired frequency from among the plurality of divided signals, and output the selected divided signal to the retiming module; wherein the retiming module is configured to receive the selected divided signal from the frequency selection module, perform a retiming operation on the selected divided signal, and output a retimed selected divided signal; and wherein the frequency division module comprises N number of differential cascading frequency divider cells configured to divide by 2 or by 3, the frequency divider cells include complementary metal-oxide-semiconductor (CMOS) logic-based high-speed differential D flip-flops, and N is an integer greater than or equal to 2.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale. In the drawings, the size and/or relative sizes of layers and regions may be exaggerated for clarity. Like reference numerals denote the same elements throughout.

Ordinary skill in the relevant art known techniques, methods and apparatus may not be discussed in detail, but in the application of these techniques, methods and apparatus, these techniques, methods and apparatus should be considered as part of this specification.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

It should be understood that when an element or layer is referred to as "in", "on", "adjacent to", "connected to", or "coupled to" another element or layer, it can be directly on the other element or layer, adjacent, connected or coupled to the other element or layer, or with one or more intervening elements or layers being present. In contrast, when an element is referred to as being "directly on," "directly adjacent with", "directly connected to" or "directly coupled to" another element or layer, no intervening elements or layers are present.

It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

Spatially relative terms, such as "below," "lower," "under," "above," "upper" and the like, may be used herein to describe the spatial relationship of one element or feature to another element(s) or feature(s) as illustrated in the figures. It will be understood that the spatially relative terms are intended to encompass different orientations of the device during use or operation, in addition to the orientation depicted in the figures. For example, if the device in the figures is turned over, elements described as "below" or "beneath" relative to other elements or features would then be oriented "above" relative to the other elements or features. Thus, the example term "below" can encompass both an orientation of above and below, depending on the orientation of the elements. The device may be otherwise oriented (rotated 90 degrees or at other orientations) and the spatially relative descriptors used herein interpreted accordingly.

The inventive concept will be herein described with reference to schematic diagrams of intermediate and final structures of different embodiments. It should be noted that the intermediate and final structures of different embodiments may be modified and connected in numerous configurations, as one of ordinary skill in the art would appreciate.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

It should be understood that the inventive concept is not limited to the embodiments described herein. Rather, the inventive concept may be modified in different ways to realize different embodiments.

According to an embodiment of the inventive concept, a mufti-modulus divider (MMD) (also referred to as a multi-modulus frequency divider) is provided. The exemplary MMD has continuous programmable (variable) division factors/ratios ranging from $2 \sim 2^{N+1}-1$, and thus provides a greater frequency division range compared to a conventional MMD. The exemplary MMD can satisfy both high speed operation and low power consumption requirements. A DIV2/3 frequency divider cell (herein referred to as "DIV2/3") that is "pseudo-differential" CMOS logic-based serves as a cell circuit of a frequency division module in the exemplary MMD. The circuit of the DIV2/3 cell includes a Mode Stop (MS) input terminal to which a set of predetermined combinational logic instructions is input. The instructions include controlling the reversal or closing of subsequent stage DIV2/3 cells that are not required for a certain operation, or that are not necessary to output the final divided signal. Accordingly, power consumption, as well as spurs generation by the frequency division module, can be reduced using the exemplary MMD.

In addition, the exemplary MMD can perform a retiming operation on an output frequency, so as to eliminate the accumulative phase noise generated by the cascading DIV2/3 cells. In particular, performance tradeoffs between low phase noise and low power consumption can be achieved using a retiming clock signal.

Figure 1:
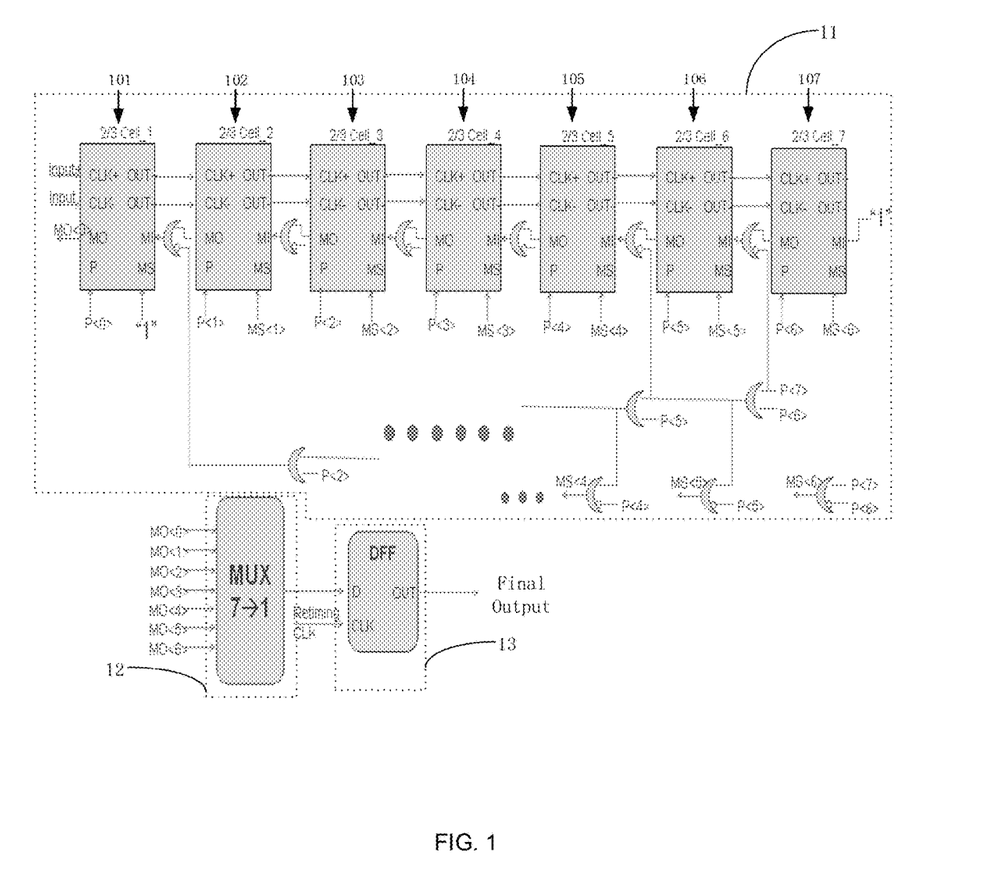
FIG. 1 is a schematic diagram of a mufti-modulus divider according to an embodiment.

FIG. 1 is a schematic diagram of a multi-modulus divider (MMD) according to an embodiment. Referring to FIG. 1, the exemplary MMD includes a frequency division module 11, a frequency selection module 12, and a retiming module 13.

The frequency division module 11 is configured to receive an input signal and perform multi-mode frequency processing on the input signal, so as to generate and output a plurality of divided signals to the frequency selection module 12.

The frequency selection module 12 is configured to receive the plurality of divided signals from the frequency division module 11, select a divided signal having a desired frequency from among the plurality of divided signals, and output the selected divided signal to the retiming module 13.

The retiming module 13 is configured to receive the selected divided signal from the frequency selection module 12, perform a retiming operation on the selected divided signal, and output a retimed selected divided signal.

The frequency division module 11 includes N number of differential cascading DIV2/3 cells. The DIV2/3 cells include CMOS logic-based high-speed differential D flip-flops, whereby N is an integer greater than or equal to 2.

In the exemplary embodiment, the differential input/output of the signal pathway and the corresponding DIV2/3 cells can operate under low power conditions and high frequency, and meet RF band requirements. Since noise interference is largely eliminated by the differential signals, the operational stability of the exemplary MMD under different working conditions (e.g., subject to various types of external interference signals) is thus improved.

As described above, the exemplary MMD includes the frequency division module including N number of differential cascading DIV2/3 cells, and the DIV2/3 cells include CMOS logic-based high-speed differential D flip-flops. Accordingly, the exemplary MMD can operate at radio frequencies and has low power consumption.

As shown in FIG. 1, a MO terminal of each DIV2/3 cell provides an output of the DIV2/3 cell, and is configured to output a divided signal to a corresponding input terminal of the frequency selection module 12.

The frequency division module 11 includes N number of differential cascading DIV2/3 cells that may be connected together in the configuration shown in FIG. 1. As a result, the frequency division module may include $2 \sim 2^{N+1}-1$ continuous variable frequency division ratios. Accordingly, the exemplary MMD has a wider frequency division range than a conventional MMD.

In the embodiment of FIG. 1, the frequency division module 11 includes N number of differential cascading DIV2/3 cells, whereby N is equal to 7. The N number of differential cascading DIV2/3 cells are connected in stages. For example, the DIV2/3 cells include a first stage DIV2/3 cell 101, a second stage DIV2/3 cell 102, a third stage DIV2/3 cell 103, a fourth stage DIV2/3 cell 104, a fifth stage DIV2/3 cell 105, a sixth stage DIV2/3 cell 106, and a seventh stage DIV2/3 cell 107. The seven DIV2/3 cells form 2~255 continuous variable frequency division circuits, whereby a ratio of the input divider to the control signal is P [7:0].

It should be noted that certain circuit connections between the various elements have been omitted from FIG. 1, in the interest of clarity. However, one of ordinary skill in the art would readily appreciate that different connections may be made between the various elements, based at least from the schematic diagram of FIG. 1.

In the frequency division module 11 of FIG. 1, the operating frequency of the DIV2/3 cells successively decreases starting from the first stage DIV2/3 cell 101 to the seventh stage DIV2/3 cell 107. For example, the operating frequency of the first stage DIV2/3 cell 101 is higher than the operating frequency of the second stage DIV2/3 cell 102, the operating frequency of the second stage DIV2/3 cell 102 is higher than the operating frequency of the third stage DIV2/3 cell 103, and so forth. Also, to minimize power consumption, the size of the transistors in the DIV2/3 cells may be successively reduced starting from the first stage DIV2/3 cell 101 to the seventh stage DIV2/3 cell 107. For example, the size of the transistors in the first stage DIV2/3 cell 101 is larger than the size of the transistors in the second stage DIV2/3 cell 102, the size of the transistors in the second stage DIV2/3 cell 102 is larger than the size of the transistors in the third stage DIV2/3 cell 103, and so forth.

In some instances, DIV2/3 cells in subsequent stages after the first stage need not be used for certain division ratios. Accordingly, the DIV2/3 cells in those subsequent stages (that need not be operated) may be turned off when selecting a frequency division mode. For example, the DIV2/3 cells in those subsequent stages after the first stage, that are not necessary to generate the final output signal of the MMD, may be turned off. Since the flip-flops in those subsequent stages may be turned off, both power consumption and spurs generation by the frequency division module can therefore be reduced. In some embodiments, the DIV2/3 cells in those subsequent stages may be turned off by applying a mode stop (MS) signal to a mode stop (MS) input terminal of the corresponding DIV2/3 cell in the subsequent stage. In some embodiments, the MS signal may be generated from P [7:0] combinational logic. It should be noted that the MS signal can also be generated from other circuits (not shown) and then applied to the MS input terminal of the corresponding DIV2/3 cell in the subsequent stage.

Figure 2:
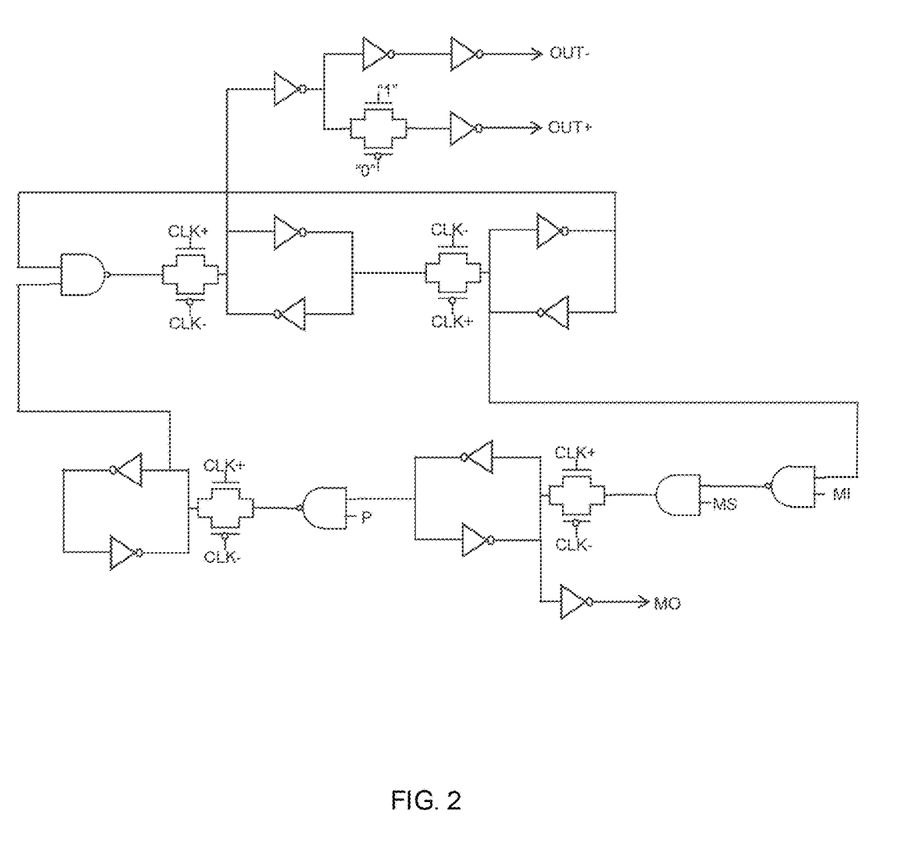
FIG. 2 is a schematic diagram of a DIV2/3 divider of a mufti-modulus divider according to an embodiment.

Different types of DIV2/3 dividers may be used for the DIV2/3 cells in the frequency division module 11. FIG. 2 is a schematic diagram of a DIV2/3 divider of a multi-modulus divider according to an embodiment. Referring to FIG. 2, the DIV2/3 divider includes CMOS logic-based high-speed differential D flip-flops (DFF).

Figure 3:
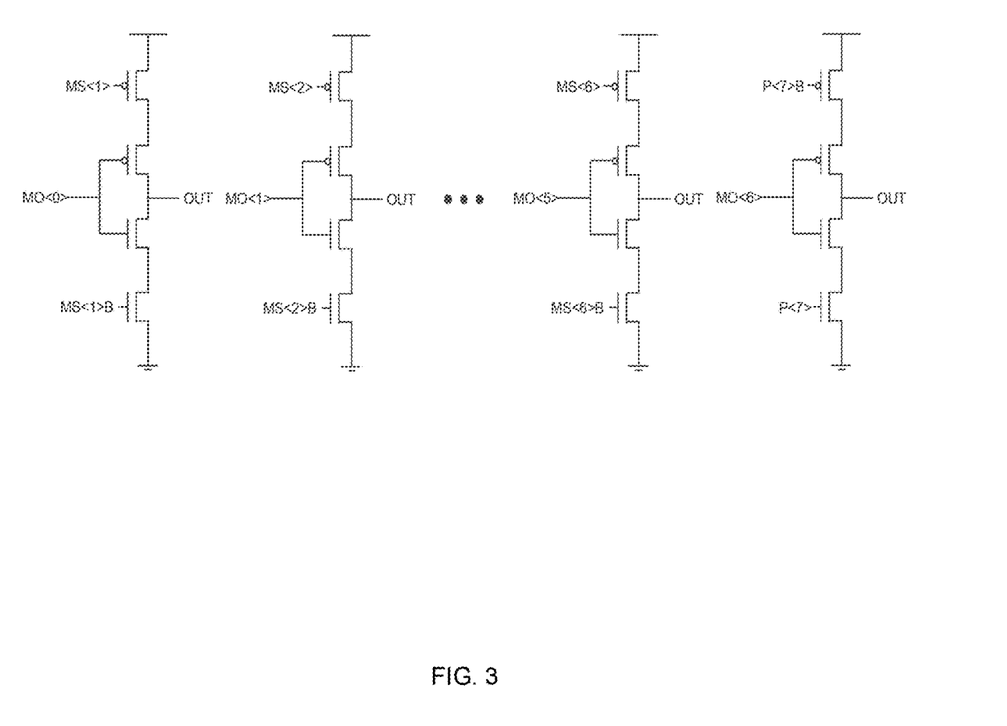
FIG. 3 is a schematic diagram of a frequency selection module of a mufti-modulus divider according to an embodiment.

FIG. 3 is a schematic diagram of a frequency selection module of a multi-modulus divider according to an embodiment. In the present exemplary embodiment, the frequency selection module 12 may be a multiplexer (MUX). The structure of the MUX is illustrated in FIG. 3. The MUX is configured to receive a plurality of divided signals, and to select and output a divided signal from among the plurality of divided signals, whereby an output frequency of the selected divided signal has a duty cycle of approximately 50%. The selected divided signal that is output by the MUX is then input to the retiming module 13 for a retiming operation.

Figure 4:
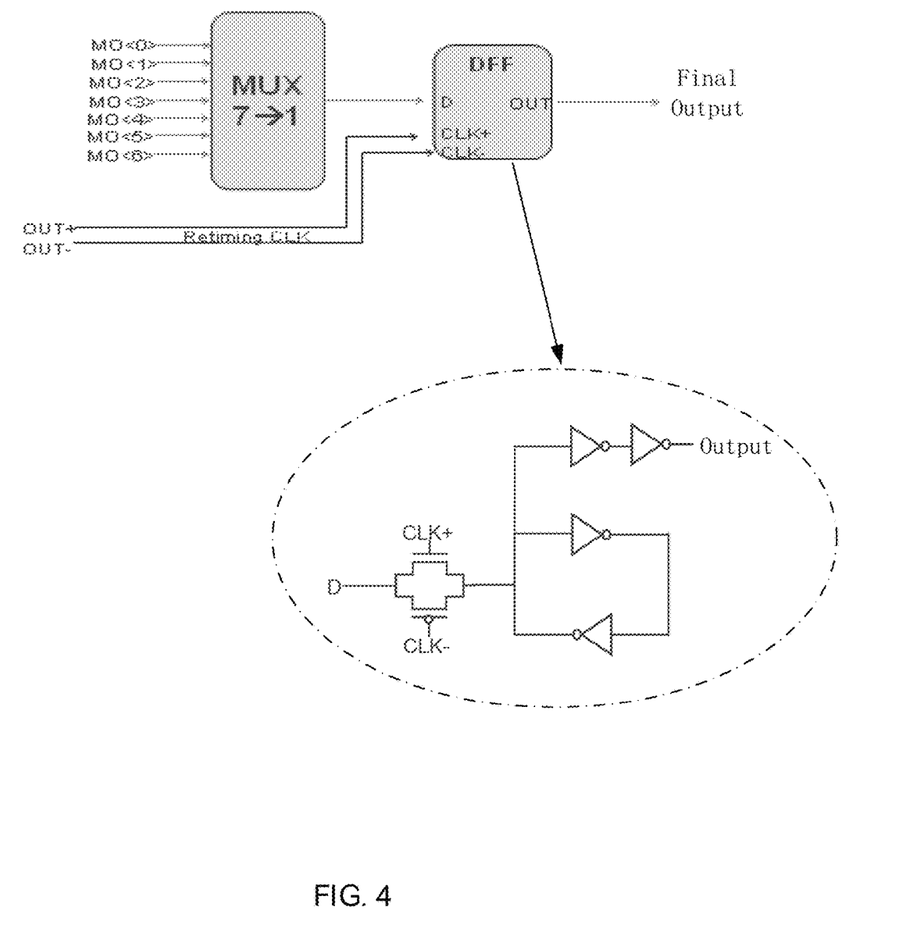
FIG. 4 is a schematic diagram of a retiming module of a mufti-modulus divider according to an embodiment.

The retiming module 13 is configured to perform the retiming operation on the final output selected divided signal. The retiming module 13 may include high-speed differential D flip-flops (DFF), for example as shown in FIG.

4. Specifically, FIG. 4 is a schematic diagram of a retiming module of a multi-modulus divider according to an embodiment. Nevertheless, it should be noted that the DFF need not be limited to the structure illustrated in the dotted circle of FIG. 4, and that other types of appropriate structures can also be used in the retiming module 13.

By using the retiming module 13 to perform a retiming operation on the final output selected divided signal, accumulative-type phase noise that is generated by the asynchronously cascaded DIV2/3 cells can be eliminated. In some embodiments, a clock of the retiming module 13 may be based on an input dock of the frequency division module 11. In the present exemplary embodiment, a retiming dock signal may be reconfigurable. For example, the retiming dock signal may be configured to reduce the operating frequency of the retiming module 13, so to achieve low power consumption. Accordingly, low phase noise and low power consumption may be simultaneously achieved.

In the above exemplary MMD, the frequency division module 11 includes N number of differential cascading DIV2/3 cells, whereby the DIV2/3 cells include CMOS logic-based high-speed differential D flip-flops. Accordingly, the exemplary MMD can operate at radio frequencies and has low power consumption. In addition, since the exemplary MMD includes the retiming module 13 configured to perform a retiming operation on the final output selected divided signal, phase noise may therefore be reduced.

Furthermore, since the exemplary MMD can control the reversal and turn off the DIV2/3 cells in subsequent stages that are not used, power consumption and spurs generation by the frequency divider can be simultaneously reduced. Accordingly, interference impact on sensitive modules of the exemplary MMD may be reduced.

It is noted that any combination of the multi-modulus frequency divider of FIG. 1, the DIV2/3 divider of FIG. 2, the frequency selection module of FIG. 3, and the retiming module of FIG. 4, may be incorporated into an electronic apparatus. The aforementioned components may be connected to other electronic components in the electronic apparatus. The electronic components may include transistors or other types of electronic components. In some embodiments, the aforementioned components can be formed on a chip that is then incorporated into the electronic apparatus.

The electronic apparatus may include mobile phones, tablet PCs, laptops, netbooks, game consoles, TVs, VCD players, DVD players, navigation systems, cameras, video cameras, voice recorders, MP3/MP4 players, PSPs, and any other electronic products or devices. The semiconductor device may also be incorporated into an intermediate product. The intermediate product may be used as stand-alone device, or integrated with other components to form a finished electronic product or device. Since the electronic apparatus includes the semiconductor device, the electronic apparatus therefore inherits its desirable characteristics (for example, low power consumption while operating at radio frequencies, reduced phase noise, reduced spurs generation, etc.).

Embodiments of a mufti-modulus divider and its components, and an electronic apparatus including the multi-modulus divider and one or more of its components, have been described in the foregoing description. To avoid obscuring the inventive concept, details that are well-known in the art may have been omitted. Nevertheless, those skilled in the art would be able to understand the implementation of the inventive concept and its technical details in view of the present disclosure.

Different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept. Therefore, the inventive concept should not be limited to the foregoing disclosure, but rather construed by the claims appended hereto.

What is claimed is:

1. A multi-modulus frequency divider comprising:
a frequency division module, a frequency selection module, and a retiming module,
wherein the frequency division module is configured to receive an input signal and perform multi-mode frequency processing on the input signal, so as to generate and output a plurality of divided signals to the frequency selection module,
wherein the frequency selection module is configured to receive the plurality of divided signals from the frequency division module, select a divided signal having a desired frequency from among the plurality of divided signals, and output the selected divided signal to the retiming module,
wherein the retiming module is configured to receive the selected divided signal from the frequency selection module, perform a retiming operation on the selected divided signal, and output a retimed selected divided signal,
wherein the frequency division module comprises N number of differential cascading frequency divider cells connected in stages, each frequency divider cell has a control input terminal and a mode stop (MS) input terminal, wherein the control input terminal accepts a combinational logic signal, the mode stop (MS) input terminal accepts a mode stop (MS) signal that is generated from the combinational logic signal, and wherein the mode stop (MS) signal turns off the corresponding frequency divider cell after the first stage.

2. The multi-modulus frequency divider according to claim 1, wherein the-frequency divider cells are configured to divide by 2 or by 3,
wherein the frequency divider cells include complementary metal-oxide-semiconductor (CMOS) logic-based high-speed differential D flip-flops, and
wherein N is an integer greater than or equal to 2.

3. The multi-modulus frequency divider according to claim 2, wherein a MO terminal of each frequency divider cell provides an output of the frequency divider cell, and is configured to output a divided signal to a corresponding input terminal of the frequency selection module.

4. The multi-modulus frequency divider according to claim 2, wherein a size of transistors in the frequency divider cells is successively reduced starting from the frequency divider cell in a first stage to the frequency divider cell in an Nth stage.

5. The multi-modulus frequency divider according to claim 2, wherein the frequency division module includes $2 \sim 2^{N+1}-1$ continuous variable frequency division ratios.

6. The multi-modulus frequency divider according to claim 2, wherein the frequency selection module comprises a multiplexer.

7. The multi-modulus frequency divider according to claim 2, wherein the selected divided signal that is output by the frequency selection module has a duty cycle of approximately 50%.

8. The multi-modulus frequency divider according to claim 2, wherein the retiming module comprises D flip-flops.

9. The multi-modulus frequency divider according to claim 2, wherein a clock of the retiming module is based on an input clock of the frequency division module.

10. The multi-modulus frequency divider according to claim 2, wherein a retiming clock signal of the retiming module is reconfigurable.

11. An electronic apparatus comprising:
a multi-modulus frequency divider and at least one electronic component connected to the multi-modulus frequency divider, wherein the multi-modulus frequency divider comprises:
a frequency division module, a frequency selection module, and a retiming module,
wherein the frequency division module is configured to receive an input signal and perform multi-mode frequency processing on the input signal, so as to generate and output a plurality of divided signals to the frequency selection module,
wherein the frequency selection module is configured to receive the plurality of divided signals from the frequency division module, select a divided signal having a desired frequency from among the plurality of divided signals, and output the selected divided signal to the retiming module,
wherein the retiming module is configured to receive the selected divided signal from the frequency selection module, perform a retiming operation on the selected divided signal, and output a retimed selected divided signal,
wherein the frequency division module comprises N number of differential cascading frequency divider cells connected in stages and configured to divide by 2 or by 3, the frequency divider cells include complementary metal-oxide-semiconductor (CMOS) logic-based high-speed differential D flip-flops, and N is an integer greater than or equal to 2, each frequency divider cell has a control input terminal and a mode stop (MS) input terminal, wherein the control input terminal accepts a combinational logic signal, the mode stop (MS) input terminal accepts a mode stop (MS) signal that is generated from the combinational logic signal, and wherein the mode stop (MS) signal turns off the corresponding frequency divider cell after the first stage.

* * * * *